United States Patent
Wu et al.

(10) Patent No.: US 10,705,170 B1
(45) Date of Patent: Jul. 7, 2020

(54) METHODS AND SYSTEMS FOR REMOVING SPIKE NOISE IN MAGNETIC RESONANCE IMAGING

(71) Applicant: GE Precision Healthcare LLC, Milwaukee, WI (US)

(72) Inventors: Dan Wu, Beijing (CN); Shiyu Li, Beijing (CN); Qingyu Dai, Beijing (CN); Kun Wang, Beijing (CN); Jiabin Yao, Beijing (CN); Yongchuan Lai, Beijing (CN)

(73) Assignee: GE PRECISION HEALTHCARE LLC, Milwaukee, WI (US)

( * ) Notice: Subject to any disclaimer, the term of this patent is extended or adjusted under 35 U.S.C. 154(b) by 0 days.

(21) Appl. No.: 16/277,922

(22) Filed: Feb. 15, 2019

(51) Int. Cl.
| | | |
|---|---|---|
| *G01V 3/00* | (2006.01) | |
| *G01R 33/56* | (2006.01) | |
| *G06T 11/00* | (2006.01) | |
| *G01R 33/385* | (2006.01) | |
| *G06T 5/00* | (2006.01) | |

(52) U.S. Cl.
CPC ..... *G01R 33/5608* (2013.01); *G01R 33/3854* (2013.01); *G06T 5/002* (2013.01); *G06T 11/006* (2013.01); *G06T 2207/10088* (2013.01); *G06T 2207/20081* (2013.01); *G06T 2207/20084* (2013.01)

(58) Field of Classification Search
USPC ........................................................ 324/309
See application file for complete search history.

(56) References Cited

U.S. PATENT DOCUMENTS

| | | | | |
|---|---|---|---|---|
| 9,324,141 | B2* | 4/2016 | Begin | G06T 5/002 |
| 2010/0085050 | A1* | 4/2010 | Dong | G01R 33/243 |
| | | | | 324/309 |
| 2018/0368781 | A1* | 12/2018 | De Man | A61B 6/5205 |
| 2019/0155709 | A1* | 5/2019 | de Oliveira | G16H 30/20 |
| 2019/0205766 | A1* | 7/2019 | Krebs | G06K 9/6256 |
| 2019/0281310 | A1* | 9/2019 | Lee | G06K 9/40 |
| 2019/0285713 | A1* | 9/2019 | Polak | G01R 33/5611 |
| 2019/0320934 | A1* | 10/2019 | Odry | A61B 5/7264 |
| 2019/0353741 | A1* | 11/2019 | Bolster, Jr. | G06K 9/0051 |
| 2019/0369190 | A1* | 12/2019 | Ye | G01R 33/56 |

OTHER PUBLICATIONS

Zhang, X. et al., "Elimination of k-space spikes in fMRI data," Magnetic Resonance Imaging, vol. 19, No. 7, Sep. 2001, 5 pages.
Campbell-Washburn, A. et al., "Using the Robust Principal Component Analysis Algorithm to Remove RF Spike Artifacts from MR Images," Magnetic Resonance in Medicine, vol. 75, No. 6, Jun. 2016, Published Online Jul. 20, 2015, 9 pages.

\* cited by examiner

*Primary Examiner* — Rodney E Fuller
(74) *Attorney, Agent, or Firm* — McCoy Russell LLP

(57) ABSTRACT

Spike noise in a k-space dataset acquired in magnetic resonance imaging may be removed by generating a mask including a set of data points which constitute spike noise in the k-space dataset based on the acquired k-space dataset via a trained deep learning network, the mask corresponding to a location of the spike noise in the acquired k-space dataset. An image reconstructed based on the acquired k-space dataset and the mask may be displayed.

18 Claims, 7 Drawing Sheets

METHODS AND SYSTEMS FOR REMOVING SPIKE NOISE IN MAGNETIC RESONANCE IMAGING

FIELD

Embodiments of the subject matter disclosed herein relate to magnetic resonance imaging, and more particularly, to removing spike noise in magnetic resonance imaging.

BACKGROUND

Magnetic resonance imaging (MRI) is a medical imaging modality that can create images of the inside of a human body without using x-rays or other ionizing radiation. Spike noise, which refers to the sharp, localized, and erroneous changes in k-space, can cause severe artifacts in an MR image. The issue of spike noise is generally difficult to completely resolve because the spike noise may be rooted in multiple sources. For example, spike noise may be due to hardware damages including broken cables, rosin at small Printed Circuit Board (PCB) joints, and others. Conventional troubleshooting methods, including cable rebooting, subsystem component replacement, require long standby time, and may lead to operation delay and high service cost. Improved methods for reducing artifacts caused by spike noise are generally desired.

BRIEF DESCRIPTION

In one embodiment, a method for magnetic resonance imaging (MRI), comprising: acquiring a k-space dataset; identifying, by a trained deep learning network, data points which constitute spike noise in the k-space dataset; updating the k-space dataset by removing the spike noise from the k-space dataset; and reconstructing a magnetic resonance image by using the updated k-space dataset. In this way, the spike noise may be removed from the reconstructed image.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present disclosure will be better understood from reading the following description of non-limiting embodiments, with reference to the attached drawings, wherein below.

DETAILED DESCRIPTION

Figure 3A:
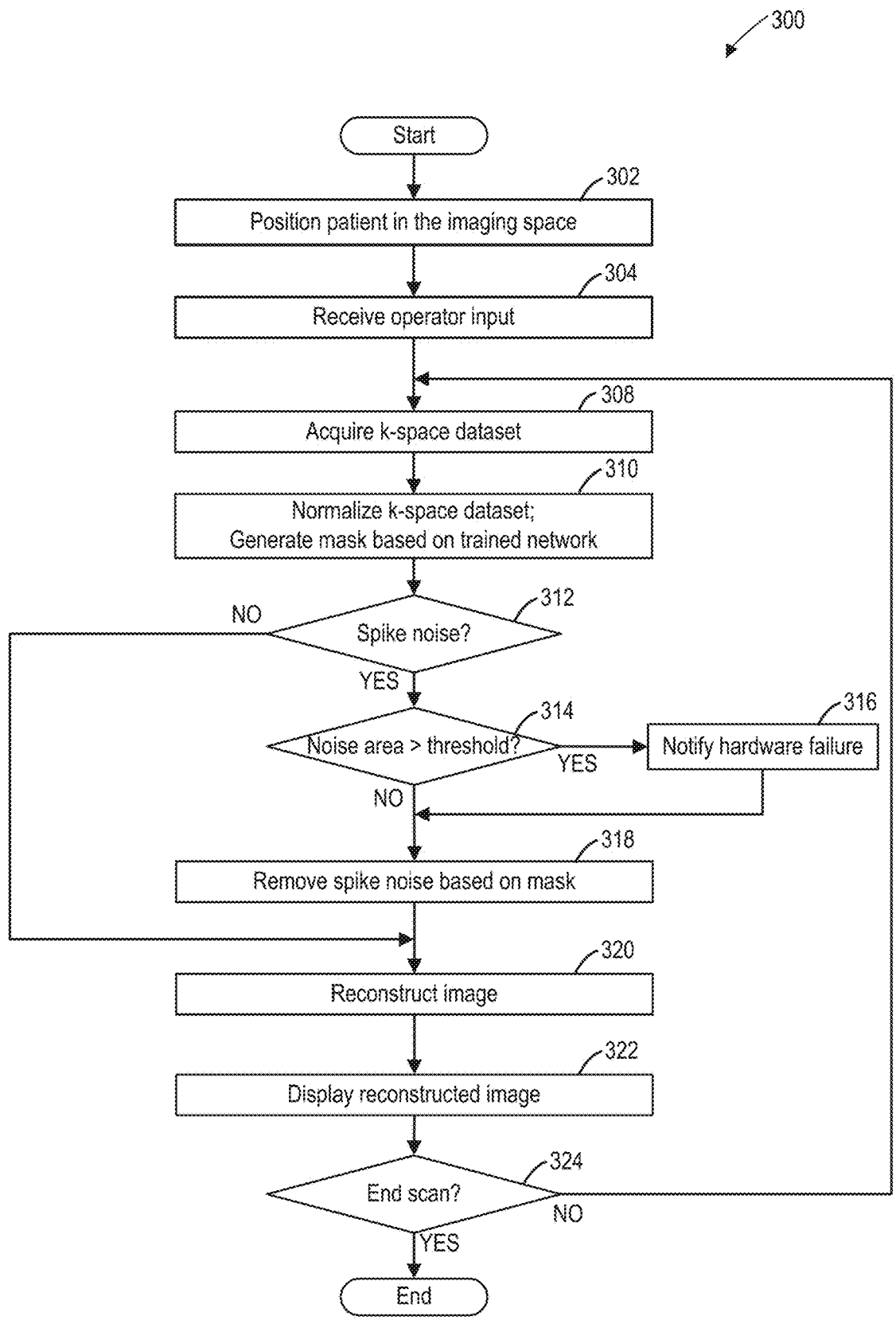
FIG. 3A is a flow chart of a method for removing spike noise, according to an exemplary embodiment.
Figure 3B:
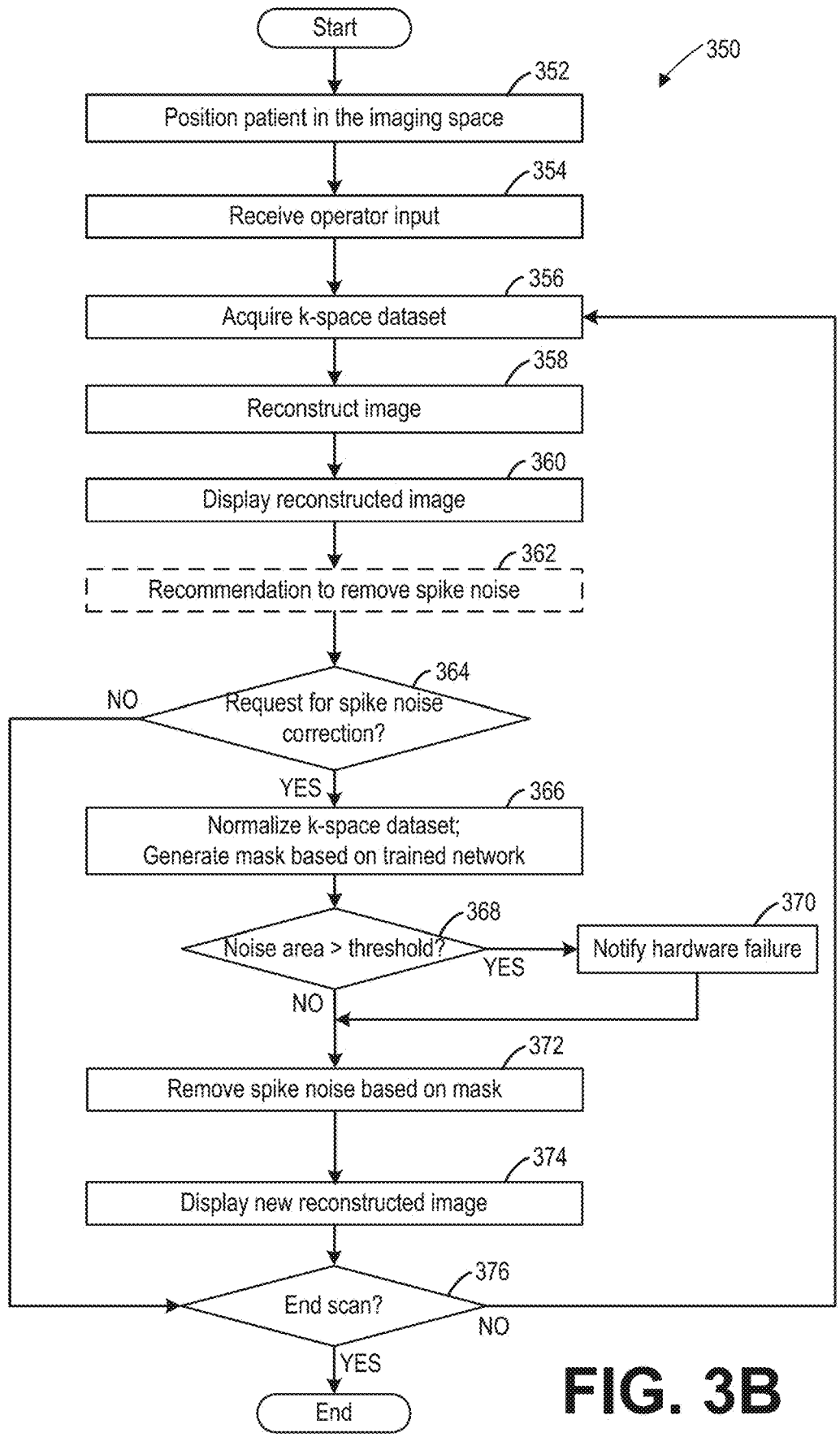
FIG. 3B is a flow chart of a method for removing spike noise based on request, according to an exemplary embodiment.
Figure 4:
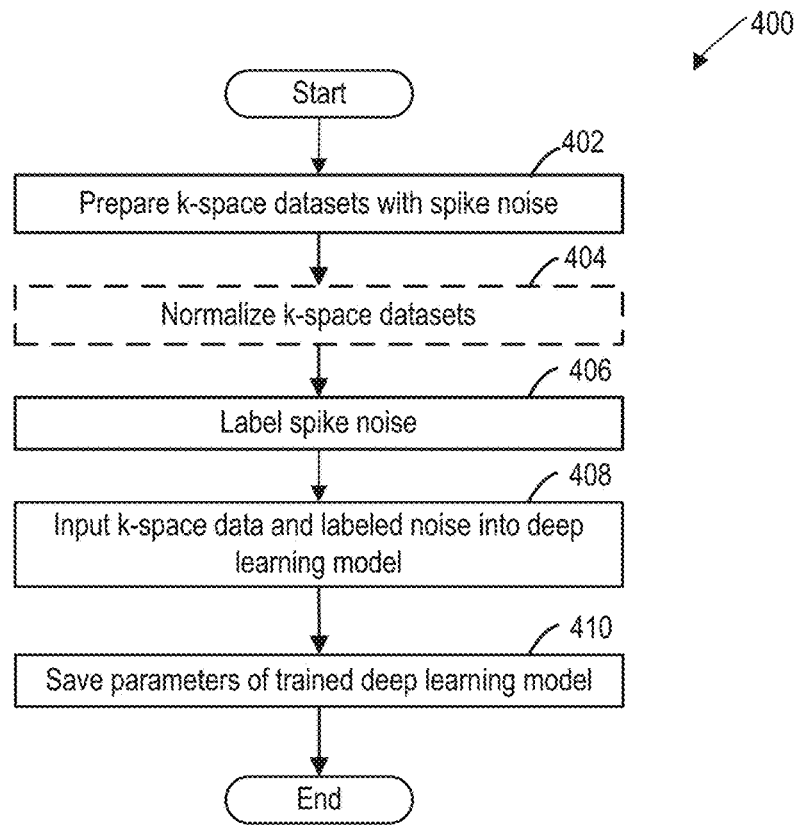
FIG. 4 is a flow chart of a method for training a deep learning network, according to an exemplary embodiment.
Figure 5:
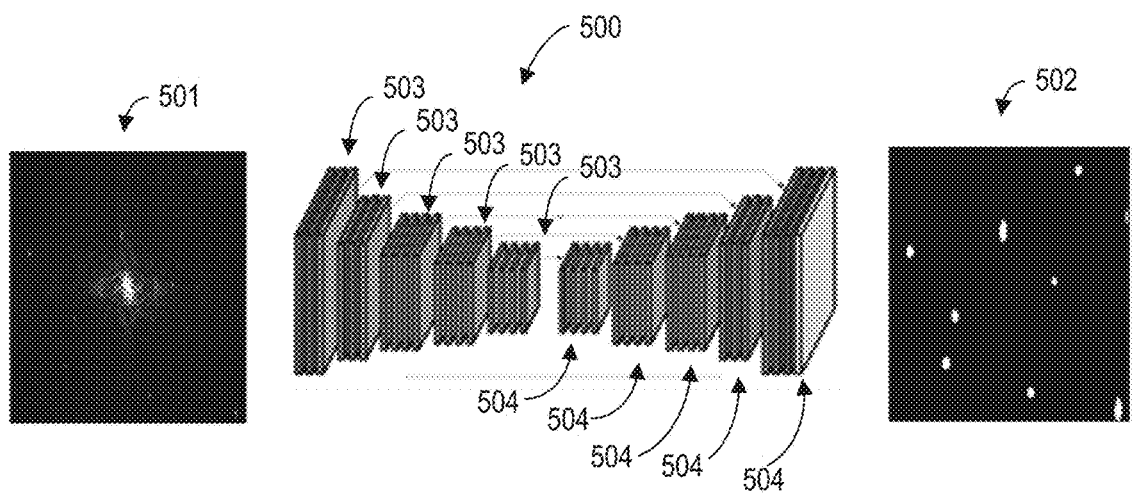
FIG. 5 shows structure of a deep learning network used in FIG. 4, according to an exemplary embodiment.

The following description relates to various embodiments for removing the spike noise from k-space dataset acquired during magnetic resonance imaging (MRI). The k-space dataset may be acquired via an imaging apparatus, such as the imaging apparatus shown in FIG. 1. During imaging, spike noise (e.g., sharp and localized changes) may appear in the acquired k-space data, as shown in the k-space data of FIG. 2. The spike noise may be introduced due to hardware damages such as broken cable and small PCB rosin joint. The spike noise may be removed by fixing hardware of the imaging apparatus, which may be both expensive and time consuming. Under certain conditions, the spike noise may be temporarily removed via a software based method, without altering the hardware. FIGS. 3A-3B show example software based methods for removing the spike noise in the k-space data during the MRI scan. In particular, the acquired k-space data is processed by a trained deep learning network, which generates a mask showing location(s) of the spike noise. The spike noise is then removed from the k-space data based on the mask and the image is reconstructed in the image space. In one example, prior to image reconstruction, spike noise removal may always be carried out following each k-space dataset acquisition. In another example, spike noise removal may be carried out based on a request for spike noise removal following image reconstruction after acquisition of a k-space dataset. Further, the methods of FIGS. 3A-3B may indicate the hardware failure if the spike noise cannot be effectively removed by the software based method. FIG. 4 shows an example method for training the deep learning network. FIG. 5 shows structure of the deep learning network, according to an exemplary embodiment. FIGS. 6A-6D and FIGS. 7A-7D show exemplary k-space datasets and corresponding MRI images before and after the spike noise is removed according to the method of FIG. 3A or 3B.

Figure 1:
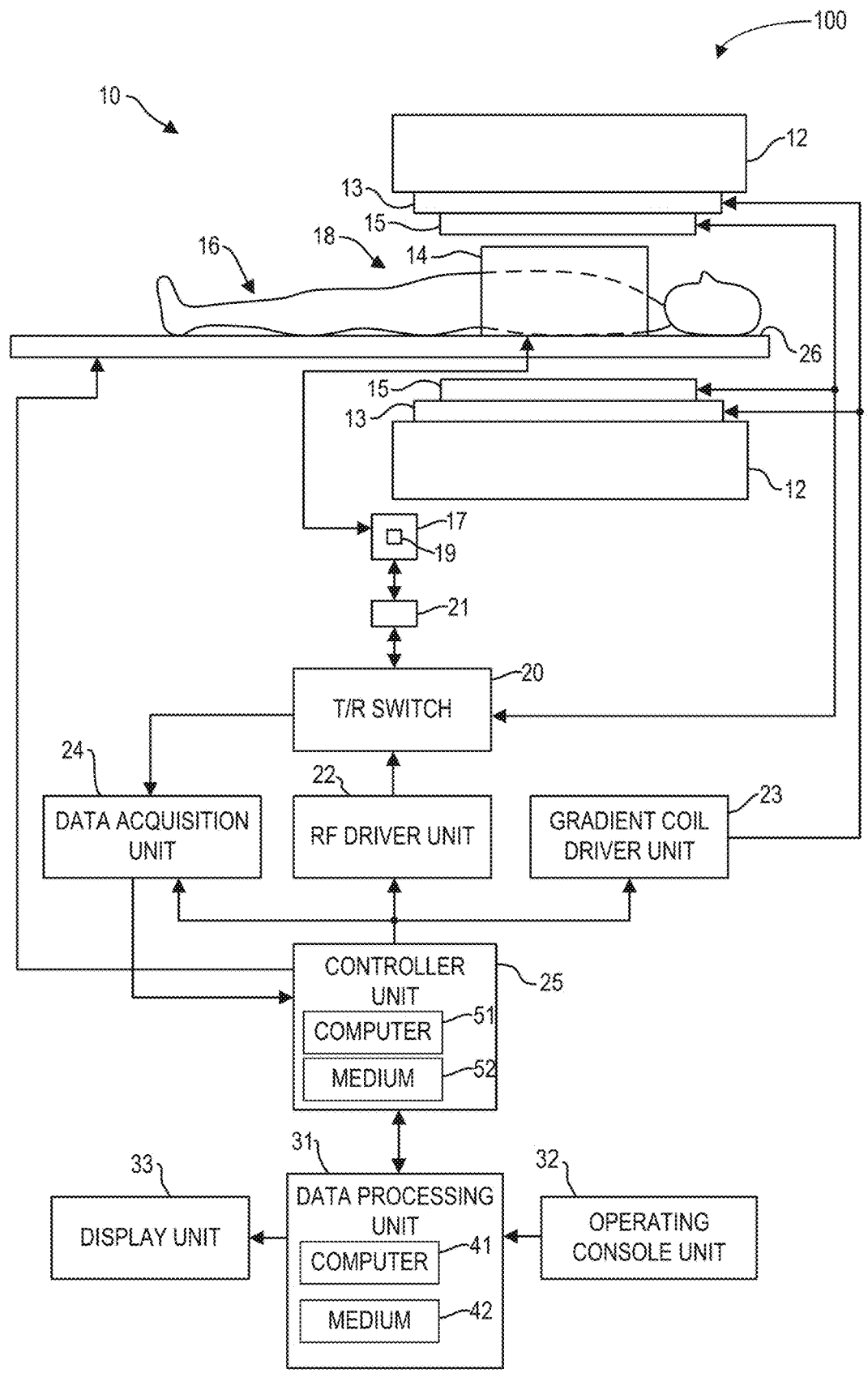
FIG. 1 is a block diagram of an MRI system according to an exemplary embodiment.

FIG. 1 illustrates a magnetic resonance imaging (MRI) apparatus 10 that includes a scanner 100, a data acquisition unit 24, a controller unit 25, a data processing unit 31, an operating console unit 32, and a display unit 33. The scanner 100 may include a magnetostatic field magnet unit 12, a gradient coil unit 13 (also referred herein as gradient coil assembly), an RF coil unit 14 (also referred herein as RF coil assembly), a patient table or bed 26, an a RF body or volume coil unit 15, a transmit/receive (T/R) switch 20, an RF driver unit 22, and a gradient coil driver unit 23. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components. The MRI apparatus 10 transmits electromagnetic pulse signals to the subject 16 placed in an imaging space 18 with a static magnetic field formed to perform a scan for obtaining magnetic resonance signals from the subject 16. One or more images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF coil unit 15 transmits, based on a control signal from the controller unit 25, an RF pulse that is an electromagnet wave to the subject 16 and thereby generates a high-frequency magnetic field $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI apparatus 10 and replaced with another RF coil unit, the RF body coil unit 15 is fixedly attached and connected to the MRI apparatus 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 may include a computer 51 and a computer readable recording medium 52 on which a program to be executed by the computer is recorded. In some embodiments, the program may be saved as instructions in a non-transitory memory. The program when executed by the computer may cause various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 may include a computer 41 and a computer-readable recording medium 42 on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a two-dimensional (2D) slice image or three-dimensional (3D) image of the subject 16 generated by the data processing unit 31.

Figure 2:
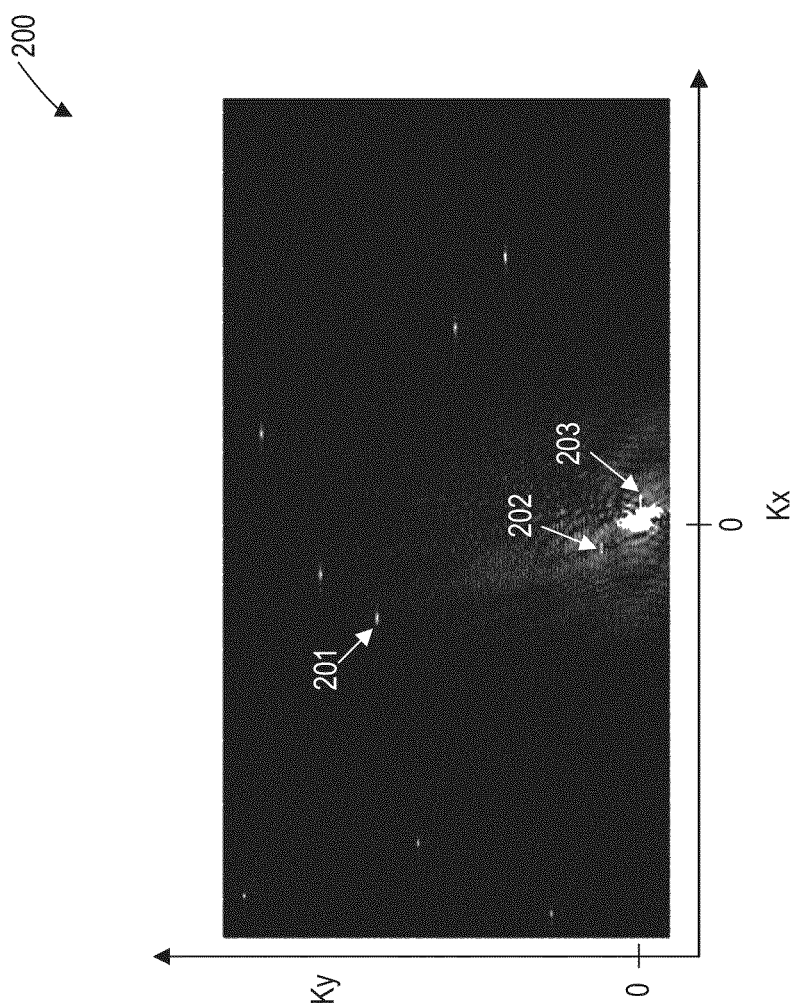
FIG. 2 shows an example k-space dataset with spike noise.

FIG. 2 shows an example k-space dataset 200 with spike noise. The k-space dataset may be two-dimensional or three-dimensional. Each data point of the k-space dataset may be a complex value. In FIG. 2, the magnitude of each data point (i.e., the absolute value of the complex value) is displayed in greyscale. The x-axis is the frequency encoding direction Kx, and the y-axis is the phase encoding direction $K_y$. FIG. 2 shows an incomplete k-space dataset wherein the center of the k-space (that is, Ky=0 and Kx=0) is not at the center of the dataset. A complete k-space dataset (that is, the center of k-space at the center of the k-space dataset) may be obtained based on the incomplete k-space dataset 200. For example, the value of a missing data point (that is, data point not acquired in the k-space dataset) may be filled based on the data point symmetric to the missing data point relative to the k-space center. An MRI image may be generated based on the complete k-space.

Spike noise (201, 202, and 203) is present in the k-space dataset 200. A spike may be easily identified and removed if the spike is far away from the k-space center, such as the spike 201. However, if a spike is close to the k-space center, such as the spikes 202 and 203, it may hard to be identified and removed. Because strong MRI signals generated from the image subject may locate close to the k-space center, the spikes may overlap with the MRI signals in k-space, and are hard to be distinguished from the MRI signals.

FIG. 3A shows method 300 for reducing spike noise for an MRI imaging apparatus, such as the MRI imaging apparatus 10 of FIG. 1. In particular, responsive to the presence of spike noise in each acquired k-space dataset, method 300 reduces/removes the noise based on data points which constitute spike noise in the k-space dataset (also referred herein as mask) generated from the acquired k-space data, using a trained deep learning network. The mask shows locations of the spikes in the acquired k-space data. Instructions for performing method 300 and the rest of the methods included herein may be saved in the memory (medium 52 and 42 of FIG. 1) of the MRI imaging apparatus, and executed by a controller of the MRI apparatus. At 302, responsive to an operator's instruction, the controller unit may move the table (such as table 26 of FIG. 1) to position the subject (such as a patient) in the imaging space (such as imaging space 18 of FIG. 1) of the MRI imaging apparatus. In some embodiments, the operator's instructions may be received by the operating console unit (such as operating console unit 32 of FIG. 1) and sent to the controller (such as controller 25 of FIG. 1) via the data processing unit (such as data processing unit 31 of FIG. 1).

At 304, operator input is received at the controller regarding the patient information and the imaging protocol. In particular, the operator may select the protocol based on the anatomy to be scanned. The imaging protocol may include the region of interest (ROI), the field of view (FOV), and the k-space sampling sequence, among other parameters. In some embodiments, the operator's input may be received by the operating console unit (such as operating console unit 32 of FIG. 1) and sent to the controller (such as controller 25 of FIG. 1) via the data processing unit (such as data processing unit 31 of FIG. 1).

At 308, the image subject is scanned according to the imaging protocol determined at 304, and a k-space dataset corresponding to a cross-section of the image subject is acquired. The scan may be executed based on programs saved in the medium of the controller. The acquired k-space dataset may be two-dimensional, and corresponds to a slice or a frame of the image. Each data point of the k-space dataset may be a complex value. It should be understood that although two-dimensional k-space dataset is used as an example for illustration, the disclosure herein applies to three-dimensional k-space dataset with appropriate adjustment.

In some embodiments, the acquired k-space dataset may be incomplete (such as the k-space dataset of FIG. 2), and not cover the entire k-space. The acquired k-space dataset may be sent to the data processing unit (such as the data processing unit 31 of FIG. 1) for the subsequent noise removal and reconstruction.

At 310, a mask (data points) corresponding to locations of pikes in the acquired k-space dataset is generated using a trained deep learning network. In some embodiments, the acquired k-space dataset is normalized before being processed by the deep learning network. The normalization and mask generation may be executed in the data processing unit according to instructions saved in the medium of the data processing unit. Step 310 may further include generating a complete k-space dataset based on the acquired k-space dataset, if the acquired k-space dataset is incomplete.

In some embodiments, the acquired k-space dataset may be normalized by adjusting the size of the acquired k-space datasets based on the requirement of the trained deep learning network. For example, if the trained deep learning network requires the input dataset to be 512×512 data points, the size of the acquired k-space dataset may be adjusted (such as via interpolation or down sampling) to be 512×512 data points. In other embodiments, if the dimension of the acquired k-space dataset is the same as the dimension required by the trained deep learning network, the acquired k-space dataset may not be normalized before being input to the trained deep learning network.

In some embodiments, the trained deep learning network may take the normalized or the acquired k-space dataset as input, and output the mask having the same dimension as the input dataset. For example, the magnitude of the acquired k-space values in the dataset may be input to the trained deep learning network to generate the mask indicating locations of the noise in the input dataset. The mask may include numerical numbers zero (0) and one (1), wherein the zero value indicates that the data point is noise, and the value of one indicates that the data point is not noise. In one example, if all pixels of the mask have the value of one, no noise is detected in the input dataset. Details regarding the configuration of the deep learning network, and generating the mask using the trained deep learning network are shown in FIG. 5.

At 312, the presence of the spike noise in the k-space data is determined. In some embodiments, the presence of the spike noise may be determined based on the mask generated at 310. In one example, if the mask includes zero value data point, the k-space dataset is determined to include spike noise. In another example, if the mask does not include zero value data point, the k-space dataset is determined to be free of spike noise.

If the k-space dataset includes spike noise (i.e., "YES" at 312), the area of the noise is determined at 314. Otherwise, if the k-space dataset is spike noise free (i.e., "NO" at 312), an image is reconstructed based on the acquired k-space data at 320.

At 314, a noise area is calculated and compared with a threshold area. Calculating the noise area may include identifying individual spikes and calculating the area of each individual spike. In some embodiments, the individual spike in the k-space dataset may be identified if the noise region in the mask (e.g., region of zero value) is enclosed with data points with the value one. In some embodiments, the outline of each individual spike may be delineated in the mask.

In some embodiments, if any of the individual spike areas is greater than the threshold area, hardware failure is notified at 316. The threshold area may be set differently for different systems due to different hardware configuration. In other embodiments, the maximum individual spike area is compared with the threshold area. If the maximum area is greater than the threshold area, hardware failure is notified at 316. If none of the individual spike areas is greater than the threshold area, the method proceeds to 318 where spike noise is removed.

Alternatively, in some embodiments, locations of the spikes in different frames (or slices) may be compared. In one example, the different frames are k-space dataset acquired at different time points. In another example, the different frames may be consecutively acquired over time. In some embodiments, locations of the spikes may be defined as the coordinates of the center of the zero value region. If the location of the zero value region does not change, the hardware failure may be notified at 316. Otherwise, if the location of the noise region changes, the method proceeds to 318. In this way, hardware failure may be notified responsive to spike noise appearing persistently at the same location in the k-space dataset.

At 316, hardware failure is notified. In some embodiments, the hardware failure may be displayed via the display unit to notify the operator. In some embodiments, an indicator (such as a light) in the MRI apparatus may be turned on. In some embodiments, the hardware failure notification may be stored in the controller. System hardware may be fixed responsive to hardware failure notice.

In some embodiments, the method does not include operations 314 and 316.

At 318, the spike noise in the k-space dataset is removed based on the mask generated by the trained deep learning network at 310. In one embodiment, k-space data points corresponding to the zero value region in the mask are set to the value zero. For example, the spike noise may be reduced/removed by multiplying the k-space data with the mask pixel by pixel. In another embodiment, k-space data points corresponding to the zero value region in the mask may be set as a conjugate transpose of their conjugate symmetric k-space data points. For example, the coordinates of a k-space data point is (x, y). The coordinates of its conjugate symmetric k-space data point is (−x, −y). If the conjugate symmetric k-space data point exists (that is, the k-space data at coordinates (−x, −y) is acquired at 308), and is not in the spike region (that is, the pixel at coordinates (−x, −y) in the mask is non-zero), the value of the k-space data point may be replaced with the conjugate transpose of the value of the conjugate symmetric k-space data point.

At 320, an MRI image may be reconstructed from the k-space dataset. Reconstructing the image from the k-space dataset may include Fourier transforming the k-space dataset into the image space.

At 322, the reconstructed MRI image may be displayed via the display unit. Further, the reconstructed MRI image may be saved in the memory of the imaging apparatus.

At 324, if the scan is completed, method 300 ends. Otherwise, another k-space dataset may be acquired. In one example, the table may be moved to scan another cross-section of the image subject.

In this way, the spike noise may be identified and reduced/removed from the acquired k-space dataset before the k-space dataset is reconstructed into the image. Locations of the spikes may be determined with the trained deep learning network. Further, in some embodiments, hardware failure may be notified based on the area of the spike noise.

FIG. 3B shows method 350 for reducing spike noise for an MRI imaging apparatus, such as the MRI imaging apparatus 10 of FIG. 1 based on a request for spike noise reduction. In particular, responsive to the request for spike noise removal in a reconstructed image, method 350 reduces/removes the noise online/offline based on data points which constitute spike noise in the k-space dataset (also referred herein as mask) generated from the acquired k-space data, using a trained deep learning network.

At 352, responsive to an operator's instruction, the controller unit may move a table (such as table 26 of FIG. 1) of the MRI imaging apparatus to position the subject (such as a patient) in the imaging space (such as imaging space 18 of FIG. 1) of the apparatus. In some embodiments, the operator's instructions may be received by the operating console unit (such as operating console unit 32 of FIG. 1) and sent to the controller (such as controller 25 of FIG. 1) via the data processing unit (such as data processing unit 31 of FIG. 1).

At 354, operator input is received at the controller regarding the patient information and the imaging protocol. In particular, the operator may select the protocol based on the anatomy to be scanned. The imaging protocol may include the region of interest (ROI), the field of view (FOV), and the k-space sampling sequence, among other parameters. In some embodiments, the operator's input may be received by the operating console unit (such as operating console unit 32 of FIG. 1) and sent to the controller (such as controller 25 of FIG. 1) via the data processing unit (such as data processing unit 31 of FIG. 1).

At 356, a k-space dataset corresponding to a cross-section of an image subject is acquired by scanning the image subject according to the imaging protocol determined at 354. The scan may be executed based on programs saved in the medium of the controller. The acquired k-space dataset may be two-dimensional, and corresponds to a slice or a frame of the image. Each data point of the k-space dataset may be a complex value. It should be understood that although two-dimensional k-space dataset is used as an example for illustration, the disclosure herein applies to three-dimensional k-space dataset with appropriate adjustment.

In some embodiments, the acquired k-space dataset may be incomplete (such as the k-space dataset of FIG. 2), and not cover the entire k-space. The acquired k-space dataset may be sent to the data processing unit (such as the data processing unit 31 of FIG. 1) for the subsequent noise removal and reconstruction.

At 358, an MRI image may be reconstructed based on the k-space dataset. Reconstructing the image based on the k-space dataset may include Fourier transforming the k-space dataset into the image space. At 360, the reconstructed MRI image may be displayed via the display unit.

At 362, a recommendation may be made to remove spike noise from the reconstructed and displayed image. The recommendation may be displayed on the display unit and/or communicated by the operator to the customer (such as the patient being scanned). In one example, the recommendation may be made by the controller unit based on either the k-space dataset or the reconstructed image (pixels). In order to estimate spike noise, the control unit may determine presence of sharp and localized changes in the k-space dataset or the reconstructed image. The data processing unit may quantitatively estimate a number (or density/distribution) of spike noise in the k-space dataset or the reconstructed image and compare the number (or density/distribution) to a threshold. If the number (or density/distribution) of spike noise in the k-space dataset or the reconstructed image is higher than a threshold, the recommendation to remove noise from the displayed image may be conveyed to the operator and/or customer. In another example, the operator may visually analyze the displayed image and upon observing one or more spike noise in the image may recommend removal of the spike noise from the image. Step 362 is an optional step and may be omitted while carrying out method 350.

At 364, the routine includes determining if a request is submitted for spike noise correction. The request may be made by the operator by clicking a button or via a touchscreen on a user interface of the apparatus. In one example, the request may be made in response to the recommendation for spike noise removal in step 360. In another example, the request may be made in response to the customer suggesting noise reduction/removal of the displayed image. Upon seeing the image in the display unit, the customer may notice one or more spike noise and may insist on removal of the noise.

If a request for spike removal is received, at 366, a mask (data points) corresponding to locations of spikes in the acquired k-space dataset is generated using a trained deep learning network. In some embodiments, the acquired k-space dataset is normalized before being processed by the deep learning network. The normalization and mask generation may be executed in the data processing unit according to instructions saved in the medium of the data processing unit. The normalization of k-space dataset and generation of mask is elaborated in step 310 of FIG. 3A and is not reiterated.

At 368, a noise area is calculated and compared with a threshold area. Calculating the noise area may include identifying individual spikes and calculating the area of each individual spike. In some embodiments, the individual spike in the k-space dataset may be identified if the noise region in the mask (e.g., region of zero value) is enclosed with data points with the value one. In some embodiments, the outline of each individual spike may be delineated in the mask.

In some embodiments, if any of the individual spike areas is greater than the threshold area, hardware failure is notified at 370. The threshold area may be set differently for different systems due to different hardware configuration. In other embodiments, the maximum individual spike area is compared with the threshold area. If the maximum area is greater than the threshold area, hardware failure is notified at 370. If none of the individual spike areas is greater than the threshold area, the method proceeds to 372 where spike noise is removed/reduced.

Alternatively, in some embodiments, locations of the spikes in different frames (or slices) may be compared. In one example, the different frames are k-space dataset acquired at different time points. In another example, the different frames may be consecutively acquired over time. In some embodiments, locations of the spikes may be defined as the coordinates of the center of the zero value region. If the location of the zero value region does not change, the hardware failure may be notified at 370. Otherwise, if the location of the noise region changes, the method proceeds to 372. In this way, hardware failure may be notified responsive to spike noise appearing persistently at the same location in the k-space dataset.

At 370, hardware failure is notified. In some embodiments, the hardware failure may be displayed via the display unit to notify the operator. In some embodiments, an indicator (such as a light) in the MRI apparatus may be turned on. In some embodiments, the hardware failure notification may be stored in the controller. System hardware may be fixed responsive to hardware failure notice.

In some embodiments, the method does not include operations 368 and 370.

At 372, the spike noise in the k-space dataset is removed based on the mask generated by the trained deep learning network at 366. An updated k-space dataset may be attained after removal of spike noise from the k-space dataset (original) acquired at step 356. A method of removal of spike noise in the k-space dataset based on the mask is elaborated in step 318 in FIG. 3A and not reiterated.

At 374, a new reconstructed MRI image may be displayed via the display unit. Further, the reconstructed MRI image may be saved in the memory of the imaging apparatus. The new MRI image may be reconstructed from the updated k-space dataset. Reconstructing the image from the updated k-space dataset may include Fourier transforming the updated k-space dataset into the image space.

In one example, steps 366 to 374 may be carried out offline and not at the data processing unit (such as data processing unit 31 of FIG. 1) of the imaging apparatus. The controller unit (such as controller unit 25 in FIG. 1) may send the digital signal to a remote (offline) processing unit (such as an edge device or a cloud) via a wireless or wired connection and the data processing may be carried out in the remote processing unit. In this way, by outsourcing the data processing to a remote unit, computation power of the data processing unit of the apparatus may not be used up, thereby increasing the speed of operation of the onboard data processing unit.

If at step 364, it is determined that a request for spike noise correction has not been made, the routine directly proceeds to step 376. At 376, if the scan is completed, method 350 ends. Otherwise, another k-space dataset may be acquired. In one example, the table may be moved to scan another cross-section of the image subject.

In this way, the spike noise may be identified and reduced/removed from the acquired k-space dataset based on a request for removal of any spike noise.

FIG. 4 shows an example method for training the deep learning network. In particular, the deep learning network may be trained with a plurality of k-space datasets, wherein locations of the spike noise in the k-space datasets are labeled. During the training, parameters (e.g., weights and biases) of the deep learning network are adjusted to minimize a cost function. When the cost function is lower than a threshold level, the deep learning network may be put to use.

At 402, a plurality of k-space datasets are prepared. One or more of the prepared k-space datasets include spike noise. In some embodiments, the k-space datasets may be acquired from one or more MRI apparatus. The k-space datasets may be acquired using the same k-space sampling sequence (such as FSE or GRE sampling sequence). In some embodiments, one or more of the k-space datasets may be acquired from imaging phantoms. In some embodiments, one or more the k-space datasets may be acquired from an image subject, such as a patient.

At 404, the size of the k-space datasets may optionally be normalized. In some embodiments, normalizing the k-space datasets may include adjusting the size of the k-space datasets. For example, the size of the k-space dataset may be adjusted (such as via interpolation or down sampling) to 512×512 data points.

At 406, each of the spikes in the k-space datasets is labeled. In some embodiments, the spikes in the prepared k-space datasets are labeled. In other embodiments, the spikes in the normalized k-space datasets are labeled.

In some embodiments, the spikes in the k-space datasets may be identified manually. A training mask indicating locations of the identified spikes may be generated. For example, the training mask may be of the same dimension as the k-space dataset input to the deep learning network. Pixels of the training mask at the identified spike locations are set to zero. The rest of the pixels of the training mask are set to one.

At 408, the k-space dataset from 402 or 404, and the corresponding labeled spikes (such as the training mask) may be input to the deep learning network. The parameters of the deep learning model may be adjusted to minimize a cost function. In one example, the cost function is in the form of weighted cross entropy loss.

At 410, the parameters of the trained deep learning model are saved, for example, in a memory. In some embodiments, the trained deep learning model can be put to use when the value of the cost function is lower than a predetermined threshold value.

In this way, the trained deep learning network is generated based on a plurality of k-space dataset and labeled spikes in the plurality of k-space dataset. In some embodiments, a different trained deep learning network is generated for a particular k-space sampling sequence.

FIG. 5 illustrates an example structure of the deep learning network 500. In one example, the deep learning network may be a deep neural network, e.g., a residual neural network. The deep learning network may include a ResNet network, VGG, and Alexnet. A trained deep learning network may receive a k-space dataset and output a corresponding mask showing locations of spike noise. In some embodiments, the input k-space dataset may be the magnitude of the acquired k-space dataset. For example, the input k-space dataset may be a greyscale image 501 formed by the magnitude of the acquired k-space dataset. In some embodiments, pixels of the output mask 502 include values one and zero. For example, zero value pixel (color-coded white) in the mask 502 indicates that the corresponding k-space data point is noise. The pixel value of one (color-coded black) in the mask 502 indicates that the corresponding k-space data point is not noise.

The deep learning network may be a convolutional encoder-decoder network. The encoder part of the network may include multiple downward layers 503. Each of the downward layers includes features of the input data at different scale. Each of the downward layers may include one or more convolutional layers, normalization layers, and rectified linear units (ReLU) layers. Each of the downward layers may also include a pooling layer to down sample the data. For example, via the pooling layer, the size of the data may be reduced by 4 times. The decoder part of the network may include multiple upward layers up sampled based on the down sampled data from the downward layers and the pooling indices of the pooling layers. Each of the upward layers may include one or more convolutional layers, normalization layers, and rectified linear units (ReLU) layers. Each of the upward layers may also include an upsampling layer to densify the map. For example, the upsampling layer may increase the dataset by 4 times. In some embodiments, the number of the downward layers is the same as the upward layers. For example, the number of the downward layers and the upward layers may be over 100, respectively. In one example, the number of the downward layers and the upward layers is 152, respectively.

By training the neural network with the k-space datasets and the labeled spikes, parameters of the neutral network may be determined. The parameters of the neural network may include parameters of the filters for each of the convolutional layers, normalization layers, and rectified linear units. The parameters of the neural network may also include the pooling indices of the pooling layers.

Figure 6C:
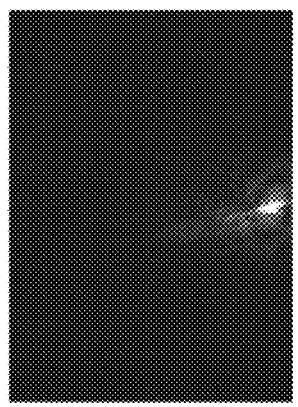
FIG. 6C shows the k-space dataset of FIG. 6A with the spike noise removed.
Figure 6D:
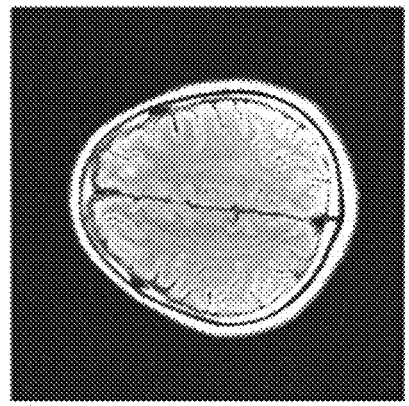
FIG. 6D shows an MRI image reconstructed from the noise-free k-space dataset of FIG. 6C.
Figure 6A:
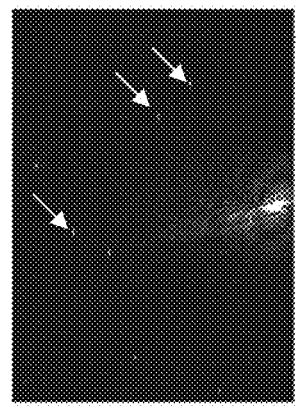
FIG. 6A shows an example k-space dataset with spike noise.
Figure 6B:
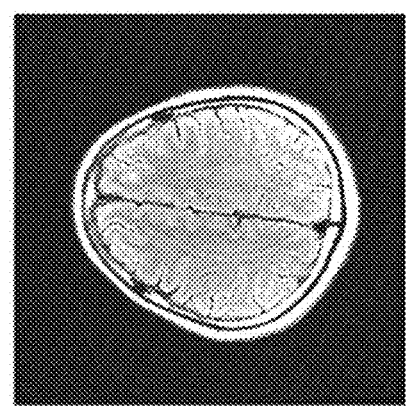
FIG. 6B shows an MRI image reconstructed from the k-space dataset of FIG. 6A.

FIGS. 6A-6D show example images of k-space dataset acquired from brain and corresponding reconstructed MRI images. FIG. 6A shows acquired k-space dataset with spike noise (highlighted by the arrows for example). FIG. 6C shows the k-space dataset with the spike noise being removed by a trained deep learning network. The spike noise was removed by using method 300 of FIG. 3A. The trained deep learning network was a 152-layer ResNet network. The deep learning network was trained according to method 400 shown in FIG. 4. The spike noise (such as spikes pointed by arrows in FIG. 6A) is absent in FIG. 6C. FIG. 6B and FIG. 6D are reconstructed based on the k-space dataset of FIG. 6A and FIG. 6C, respectively. The signal to noise ratio of FIG. 6C is improved and artifacts are reduced over FIG. 6B.

Figure 7C:
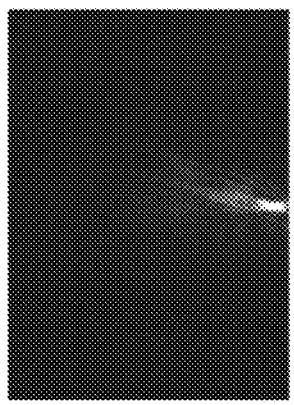
FIG. 7C shows the k-space dataset of FIG. 7A with the spike noise removed.
Figure 7D:
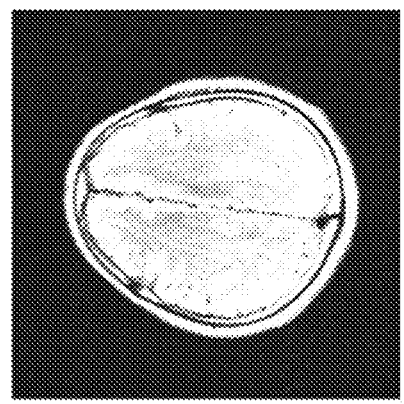
FIG. 7D shows an MRI image reconstructed from the noise-free k-space dataset of FIG. 7C.
Figure 7A:
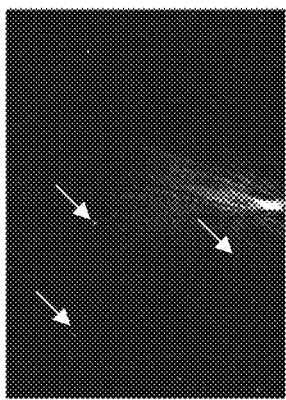
FIG. 7A shows another example k-space dataset with spike noise.
Figure 7B:
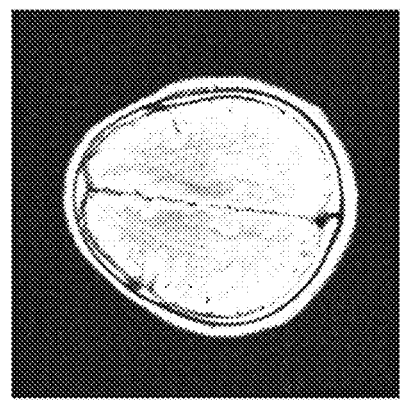
FIG. 7B shows an MRI image reconstructed from the k-space dataset of FIG. 7A.

FIGS. 7A-7D show another example images of k-space dataset of brain and corresponding reconstructed MRI images. FIG. 7A shows acquired k-space dataset with spike noise (highlighted by the arrows for example). FIG. 7C shows the k-space dataset with spike noise being removed by a trained deep learning network. The spike noise was removed based on method 300 of FIG. 3A. The trained deep learning network was a 152-layer ResNet network. The deep learning network was trained according to method 400 shown in FIG. 4. The spike noise (such as spike noises pointed by arrows in FIG. 7A) are absent in FIG. 7C. Only the spike noises are removed in FIG. 7C, but not signals generated from the image subject. FIG. 7B and FIG. 7D are reconstructed based on the k-space dataset of FIG. 7A and FIG. 7C, respectively. The signal to noise ratio of FIG. 7C is improved over FIG. 7B.

The technical effect of removing the spike noise in the k-space dataset before reconstructing the image using a trained deep learning networks is that the spike noise may be removed in real-time while performing the scan. The technical effect of determining the area of the spike noise is that spike noise that cannot be removed via the software method may be identified. Further, hardware failure causing the spike noise may be timely addressed. The technical effect of identifying the spike noise using the trained deep learning network is that spike noises may be selectively removed without affecting signals generated from the image subject.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI), comprising:
   acquiring a k-space dataset;
   identifying, by a trained deep learning network, a set of data points which constitute spike noise in the k-space dataset;
   updating the k-space dataset by removing the spike noise from the k-space dataset; and
   reconstructing a magnetic resonance (MR) image from the updated k-space dataset.

2. The method of claim 1, further comprising indicating hardware failure responsive to an area of the spike noise greater than a threshold area.

3. The method of claim 1, further comprising acquiring another k-space dataset after displaying the reconstructed MR image, generating another set of data points which constitute spike noise in the another k-space dataset based on the another k-space dataset via the trained deep learning network, and indicating hardware failure responsive to locations of the another set of data points being the same as locations of the set of data points in the k-space dataset.

4. The method of claim 1, wherein the trained deep learning network is trained for a particular sampling sequence that the k-space dataset is acquired, the trained deep learning network being a residual neural network.

5. The method of claim 1, further comprising generating parameters of the trained deep learning network based on a plurality of k-space datasets and labeled noise locations in the plurality of k-space datasets.

6. The method of claim 1, wherein the updated k-space dataset is a product of the k-space dataset and a mask showing locations of the data points which constitute spike noise in the k-space dataset.

7. The method of claim 1, wherein the reconstruction of the MR image after removal of the spike noise is carried out upon receipt of a request to remove spike noise.

8. The method of claim 7, wherein the request is in response to a higher than threshold spike noise in the k-space dataset or the reconstructed MR image.

9. A magnetic resonance imaging (MRI) apparatus, comprising:
   a gradient coil assembly;
   a radio frequency (RF) coil assembly; and
   a controller coupled to the gradient coil assembly and the RF coil assembly and configured to:
      acquire a k-space dataset via the gradient coil assembly and the RF coil assembly;
      use a trained deep learning network to identify a set of data points which constitute spike noise in the k-space dataset;
      update the k-space dataset by removing the spike noise from the acquired k-space dataset; and
      reconstruct a magnetic resonance (MR) image from the updated k-space dataset,
      wherein the reconstructed MR image is generated upon receipt of a request to remove spike noise.

10. The MRI apparatus of claim 9, further comprising a memory storing the trained deep learning network.

11. The MRI apparatus of claim 9, further comprising a display unit configured to display the reconstructed MR image.

12. The MRI apparatus of claim 9, wherein the updated k-space dataset is a product of the acquired k-space dataset and a mask showing locations of the set of data points which constitute spike noise in the acquired k-space dataset.

13. The MRI apparatus of claim 9, further comprising executable instructions that, when executed, cause the controller to indicate hardware failure responsive to an area of the spike noise greater than a threshold area.

14. A non-transitory computer-readable medium comprising instructions that, when executed, cause a processor to:
   acquire a k-space dataset;
   immediately after acquiring the k-space dataset and prior to displaying an image reconstructed based on the k-space dataset, determine, via a trained deep learning network, locations of data points that constitute noise in the k-space dataset;
   update the k-space dataset by removing noise from the acquired k-space dataset;
   display a magnetic resonance (MR) image reconstructed from the updated k-space dataset; and
   indicate hardware failure responsive to an area of the noise greater than a threshold area.

15. The non-transitory computer-readable medium of claim 14, wherein the trained deep learning network is trained based on a plurality of k-space datasets different from the acquired k-space dataset and labeled noise locations in the plurality of k-space dataset, the trained deep learning network being a convolutional decoder-encoder network with a number of layers greater than 100.

16. The non-transitory computer-readable medium of claim 14, further comprising instructions that, when executed, cause the processor to normalize the k-space dataset before determining a location of the noise in the k-space dataset.

17. The non-transitory computer-readable medium of claim 14, wherein the updated k-space dataset is generated from the acquired k-space dataset and the locations of the data points that constitute noise.

18. The non-transitory computer-readable medium of claim 14, wherein the reconstruction of the MR image is carried out upon receipt of a request to remove spike noise, the request received in response to a higher than threshold spike noise in the acquired k-space dataset.

* * * * *

UNITED STATES PATENT AND TRADEMARK OFFICE
CERTIFICATE OF CORRECTION

PATENT NO. : 10,705,170 B1
APPLICATION NO. : 16/277922
DATED : July 7, 2020
INVENTOR(S) : Dan Wu et al.

It is certified that error appears in the above-identified patent and that said Letters Patent is hereby corrected as shown below:

On the Title Page

Item (72), add Christopher Hardy, Schenectady, NY (US), to the list of inventors.

Signed and Sealed this
Fourth Day of May, 2021

Drew Hirshfeld
*Performing the Functions and Duties of the
Under Secretary of Commerce for Intellectual Property and
Director of the United States Patent and Trademark Office*